United States Patent
Chen et al.

(10) Patent No.: US 8,098,111 B2
(45) Date of Patent: Jan. 17, 2012

(54) REDUCED PHASE NOISE MULTI-BAND VCO

(75) Inventors: Calvin (Shr-Lung) Chen, Irvine, CA (US); Morteza Vadipour, Woodland, CA (US); Xinyu Chen, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 12/693,993

(22) Filed: Jan. 26, 2010

(65) Prior Publication Data

US 2011/0090017 A1 Apr. 21, 2011

Related U.S. Application Data

(60) Provisional application No. 61/252,495, filed on Oct. 16, 2009.

(51) Int. Cl.
*H03L 7/099* (2006.01)
(52) U.S. Cl. .................. 331/185; 331/117 R; 331/167; 331/186
(58) Field of Classification Search .............. 331/117 R, 331/117 FE, 167, 182, 183, 185
See application file for complete search history.

(56) References Cited

U.S. PATENT DOCUMENTS

| | | | | |
|---|---|---|---|---|
| 7,132,901 | B2* | 11/2006 | Cojocaru | 331/117 FE |
| 7,259,638 | B2* | 8/2007 | Takahashi | 331/179 |
| 2005/0068117 | A1* | 3/2005 | Banerjee et al. | 331/117 FE |
| 2006/0017515 | A1* | 1/2006 | Stanic et al. | 331/117 R |
| 2007/0080754 | A1* | 4/2007 | Park et al. | 331/185 |

* cited by examiner

*Primary Examiner* — Joseph Chang
*Assistant Examiner* — Jeffrey Shin
(74) *Attorney, Agent, or Firm* — Sterne, Kessler, Goldstein & Fox, P.L.L.C.

(57) ABSTRACT

Embodiments of a multi-band voltage controlled oscillator (VCO) are provided herein. The multi-band VCO is configured to adjust a frequency of an output signal based on an input signal. The multi-band VCO includes a tank module, an active module, and a control module. The tank module includes a parallel combination of a capacitor and an inductor. The active module includes a pair of cross-coupled transistors that are configured to provide a negative conductance that cancels out a positive conductance associated with the tank module. To improve the phase noise associated with the multi-band VCO, the control module is configured to adjust the body voltage of the cross-coupled transistors.

17 Claims, 5 Drawing Sheets

(LC Tank VCO: Adjustable $g_{active}$ Topology)

FIG. 1 (Generic LC Tank VCO)

FIG. 2 (Phase Noise v. Active Conductance)

FIG. 3 (LC Tank VCO: Conventional Topology)

FIG. 4 (LC Tank VCO: Adjustable $g_{active}$ Topology)

FIG. 5

REDUCED PHASE NOISE MULTI-BAND VCO

CROSS REFERENCE TO RELATED APPLICATIONS

This patent application claims the benefit of U.S. Provisional Patent Application No. 61/252,495, filed Oct. 16, 2009, entitled "A Reduced Phase Noise Multi-Band VCO," which is incorporated herein be reference in its entirety.

FIELD OF THE INVENTION

This application relates generally to voltage controlled oscillators (VCOs), and more particularly to multi-band VCOs.

BACKGROUND

Today's wireless devices often support multiple wireless standards that operate over multiple frequency bands. For example, a cellular phone or handset may be configured to communicate with both second and third generation wireless communications systems using multiple standards (e.g., EDGE/GSM/WCDMA) and frequency bands (e.g., the 900, 1800, and 2100 MHz bands). A wireless local area network device is another common wireless device that may be configured to support multiple standards (e.g., IEEE's 802.11a/b/g standards) and frequency bands.

These multi-band wireless devices include at least one radio frequency (RF) front-end to upconvert a signal for transmission over a wireless link and to down convert a signal received over a wireless link. Each wireless standard typically imposes strict performance requirements that often prevent the use of a single, self-contained RF front-end for all frequency bands supported by a wireless device. Consequently, a multi-band wireless device normally reproduces and customizes several circuit blocks of an RF front-end for each supported band.

The RF front-end typically includes a VCO to generate a local oscillator (LO) signal for frequency upconversion and downconversion. In wireless devices, the VCO is typically implemented using an inductor-capacitor (LC) tank circuit that includes an inductor and one or more capacitors. The frequency of the LO signal generated by the VCO can be controlled by varying the capacitance of the LC tank. A VCO can generally achieve good performance over a small tuning range (e.g., when the frequency bands of interest are within 10 to 20% of each other). However, for a large tuning range the resistive impedance of the LC tank circuit can vary considerably, which results in a relatively large and undesirable variation in the VCO phase noise over the different, supported frequency bands.

To combat phase noise, a wireless device that supports multiple bands that are spaced far apart can employ multiple VCOs. Each VCO can then be designed to achieve good performance for a specific frequency band. However, the use of multiple VCOs for multiple frequency bands increases cost and area in an integrated circuit (IC) implementation.

Therefore, what is needed is a multi-band VCO that has reduced phase noise over a large tuning range to support today's multi-band wireless devices.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

The present invention will be described with reference to the accompanying drawings. The drawing in which an element first appears is typically indicated by the leftmost digit(s) in the corresponding reference number.

DETAILED DESCRIPTION

In the following description, numerous specific details are set forth in order to provide a thorough understanding of the invention. However, it will be apparent to those skilled in the art that the invention, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the invention.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

1. Generic LC Tank VCO

Figure 1:
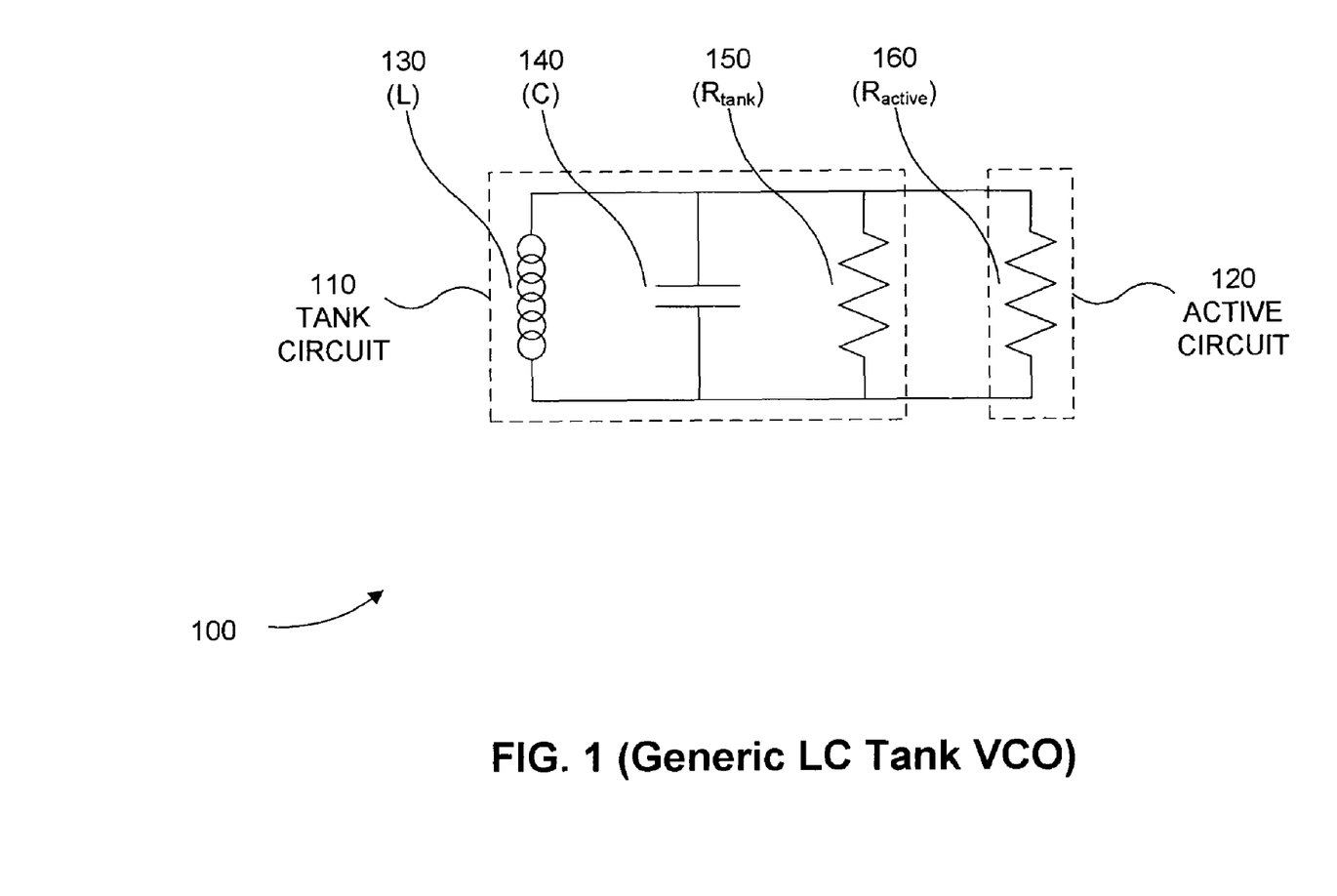
FIG. 1 illustrates a generic LC tank VCO.

FIG. 1 illustrates a generic LC tank VCO 100. The generic LC tank VCO 100 includes a tank circuit 110 and an active circuit 120.

The tank circuit 110 includes an inductor (L) 130 placed in parallel with a capacitor (C) 140. The parallel combination of L 130 and C 140 resonates at a frequency given approximately by:

$$\omega_{res} = 1/\sqrt{LC} \quad (1)$$

From equation (1), it becomes apparent that the resonant frequency of tank circuit 110 can be tuned by adjusting either the inductance of L 130 or the capacitance of C 140. In practice, the capacitance of C 140 is typically made adjustable via an input signal. For example, a bank of capacitors, configured to provide an adjustable capacitance, can be used and controlled by a digital input signal.

At the resonant frequency defined by $\omega_{res}$, the impedance of L 130 and C 140 are equal and opposite, thereby yielding a theoretically infinite impedance. However, practical inductors and capacitors, such a L 130 and C 140, have an associated series resistance. Tank circuit 110 models the total resistance of L 130 and C 140 as a parallel resistance ($R_{tank}$) 150. The finite parallel resistance, $R_{tank}$ 150, limits the quality factor (Q) of tank circuit 110. Specifically, it can be shown that the Q of tank circuit 110 is approximately given by:

$$Q_{tank} = \frac{R_{tank}}{\omega_{res} \times L} \quad (2)$$

The Q of tank circuit 110 is a dimensionless parameter that compares the tank circuit's bandwidth relative to its center frequency. The higher the Q of tank circuit 110, the lower the rate of energy loss relative to the energy stored by tank circuit 110.

Typically, in an integrated circuit (IC) implementation, the inductor(s) are on-chip spiral inductors with a low Q that dominates the losses of tank circuit 110. In other words, the Q of L 130 is much less than the Q of C 140. Therefore, the Q of tank circuit 110 can be approximated by the Q of L 130:

$$Q_{tank} = Q_L = \frac{\omega_{res} \times L}{R_L} \quad (3)$$

Substituting equation (3) into equation (2) and solving for the parallel resistance of tank circuit 110 yields:

$$R_{tank} = \frac{(\omega_{res} \times L)^2}{R_L} \quad (4)$$

From equation (4) above, it can be seen that $R_{tank}$ 150 varies with the resonant frequency $\omega_{res}$ of tank circuit 110. As the resonant frequency of tank circuit 110 increases, $R_{tank}$ 150 correspondingly increases, and as the resonant frequency of tank circuit 110 decreases, $R_{tank}$ 150 correspondingly decreases.

In order for tank circuit 110 to oscillate, the losses from $R_{tank}$ 150 need to be overcome. Therefore, an active circuit 120 is typical used to offset (i.e., cancel) the losses incurred by $R_{tank}$ 150. Active circuit 120 includes a negative, active resistance, $R_{active}$ 160, that satisfies the following equation in order to guarantee tank circuit 110 oscillates:

$$\frac{1}{R_{active}} \geq \frac{1}{R_{tank}} \quad (5)$$

Because $R_{tank}$ 150 changes with frequency (as can be seen above from equation (4)), $R_{active}$ is typically designed to satisfy equation (5) in the worst case operating scenario, thereby guaranteeing oscillation of tank circuit 110 over all possibly operating scenarios.

Typically, active circuit 120 provides $R_{active}$ 160 via an active conductance $G_{active}$, where $G_{active}=1/R_{active}$. Therefore, the worst case operating scenario is determined by the smallest $R_{active}$ 160 required to satisfy equation (5) above, which corresponds to the largest $G_{active}$ required. The smallest $R_{active}$ 160 required is determined by the lowest frequency that tank circuit 110 is configured to produce. However, as will be explained further below, simply designing $R_{active}$ to satisfy this worst case operating scenario (i.e., the lowest frequency that tank circuit 110 is configured to produce) is not optimal in terms of output phase noise of LC tank VCO 100.

2. Phase Noise v. Active Conductance

Figure 2:
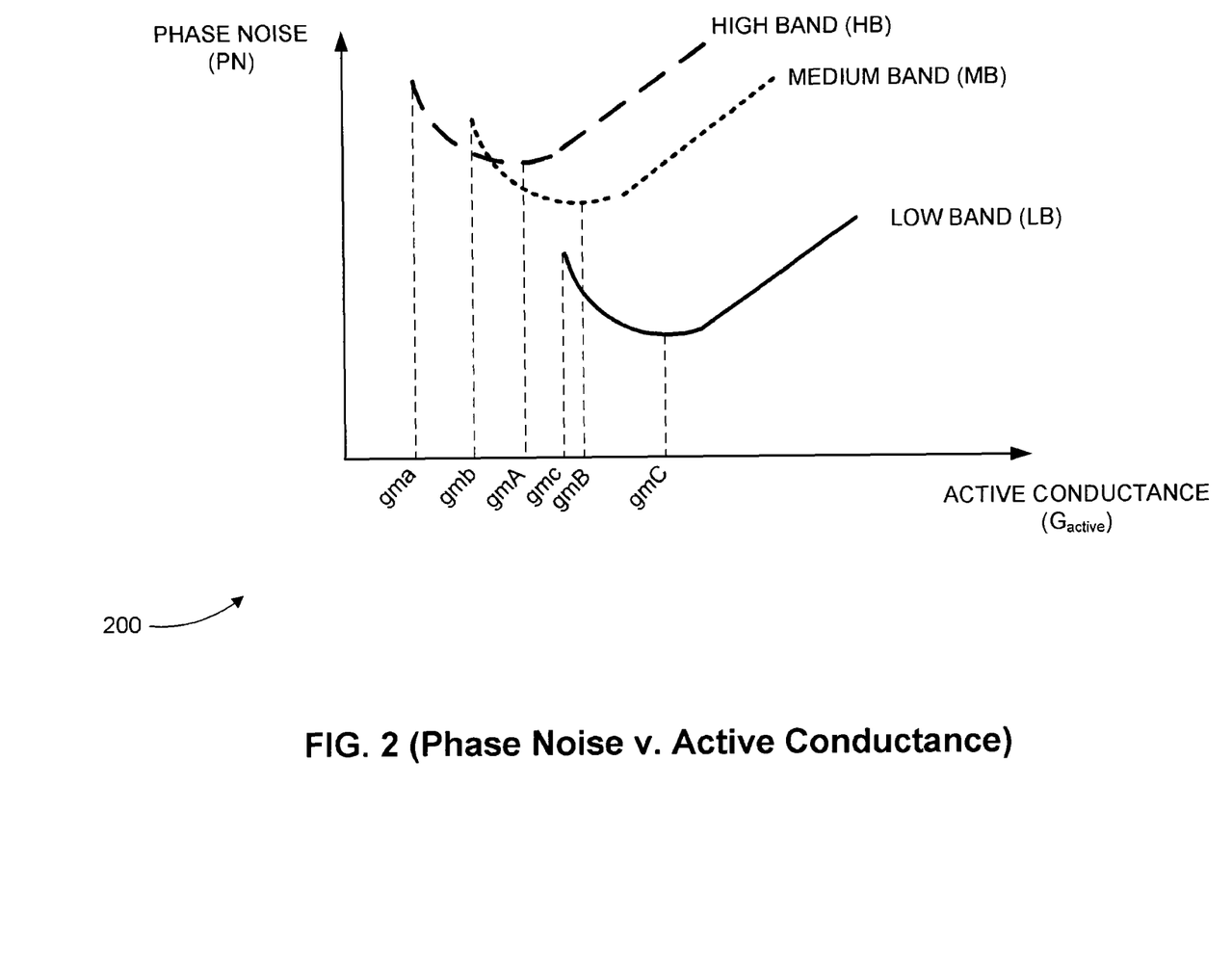
FIG. 2 illustrates a graph of phase noise versus active conductance provided by an active module of an LC tank VCO, according to embodiments of the present invention.

FIG. 2 illustrates a graph 200 of phase noise (PN) versus negative, active conductance ($G_{active}$) for three different frequency settings of an LC tank VCO, according to embodiments of the present invention. Specifically, three plots are illustrated by graph 200 to illustrate how the phase noise varies as the negative conductance of the LC tank VCO is changed. The three plots include a high band (HB) plot for a high frequency setting of the LC tank VCO, a medium band (MB) plot for a medium frequency setting of the LC tank VCO, and a low band (LB) plot for a low frequency setting of the LC tank VCO.

The negative conductance values gma, gmb, and gmc, denoted on the horizontal axis of graph 200, are the minimum values of negative conductance required to guarantee oscillation of the LC tank VCO at respective frequency settings. For example, gma is the minimum negative conductance necessary to overcome the losses of the LC tank VCO at the high frequency setting. A negative conductance setting of gmb is the minimum negative conductance necessary to overcome the losses of the LC tank VCO at the medium frequency setting.

The negative conductance values gmA, gmB, and gmC, further denoted on the horizontal axis of graph 200, are the values of negative conductance that provide for the smallest phase noise for a respective frequency setting, while still guaranteeing oscillation of the LC tank VCO. For example, gmA is the negative conductance that provides the smallest phase noise at the high frequency setting, while still guaranteeing oscillation of the LC tank VCO at that frequency. A negative conductance setting of gmB is the negative conductance that provides the smallest phase noise at the medium frequency setting, while still guaranteeing oscillation of the LC tank VCO at that frequency.

As noted above, in regard to FIG. 1, the negative conductance of an LC tank VCO, designed to operate at a plurality of frequency settings (e.g., high, medium, and low), is typically determined based on the lowest frequency setting that the LC tank VCO is to produce. By determining the negative conductance of an LC tank VCO for the lowest frequency setting, the LC tank VCO is guaranteed to oscillate at all other, higher frequency settings. For example, as illustrated by graph 200, setting the negative conductance of an LC tank VCO to gmC, guarantees that the LC tank VCO will oscillate over the high, medium, and low frequency settings denoted by graph 200. However, a negative conductance of gmC is not an optimal setting in terms of phase noise for each frequency setting. Rather, it would be beneficial to change the negative conductance of an LC tank VCO based on a current frequency setting (e.g., high, medium, or low) in order to reduce phase noise. In the specific example illustrated by graph 200, it would be beneficial to use a negative conductance substantially equal to gmA for the high frequency setting, a negative conductance substantially equal to gmB for the medium frequency setting, and a negative conductance substantially equal to gmC for the low frequency setting.

3. Conventional LC Tank VCO Topology with Fixed Conductance

Figure 3:
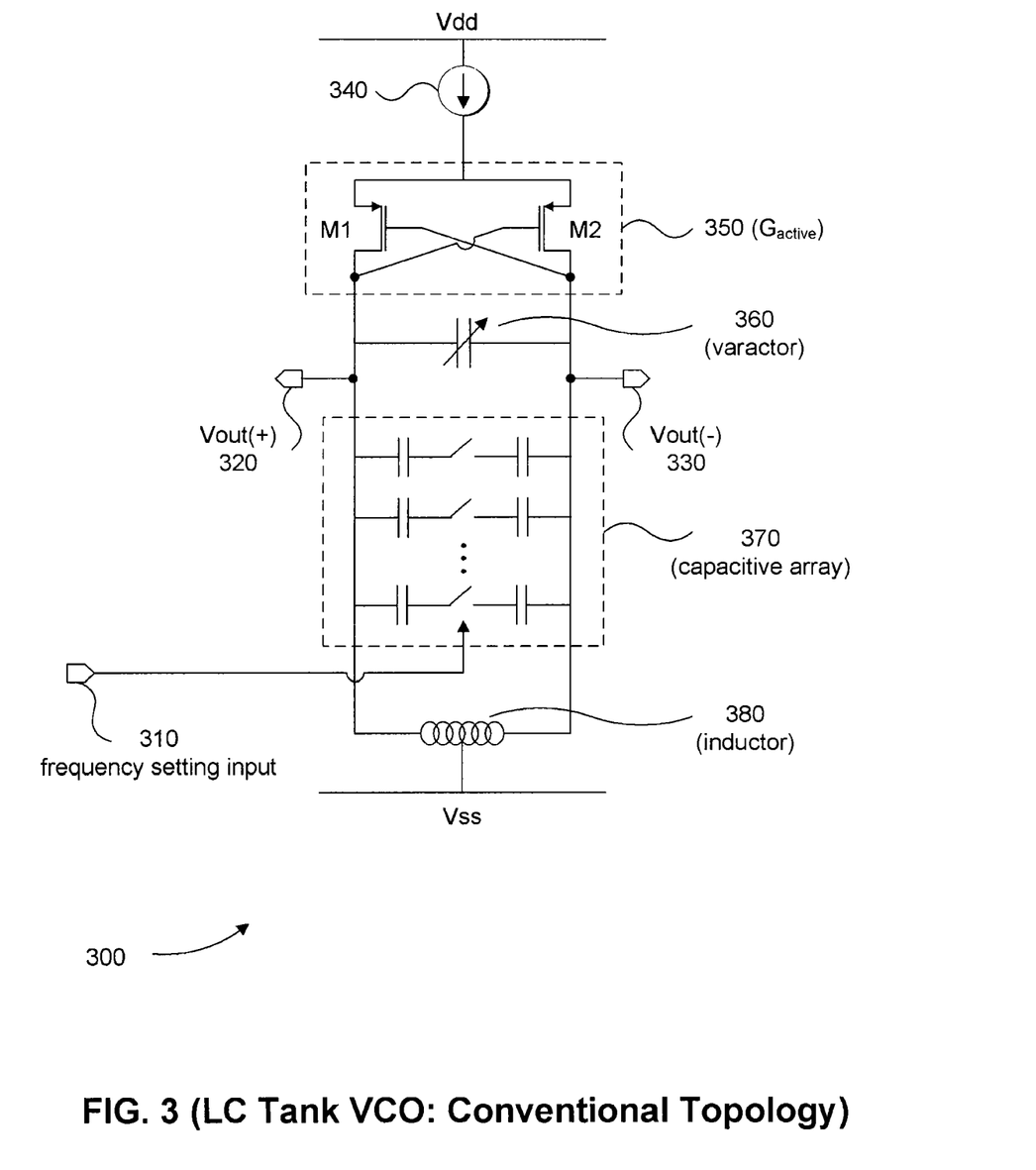
FIG. 3 illustrates a conventional topology for an LC tank VCO that has a fixed, active conductance.

FIG. 3 illustrates a conventional topology 300 for an LC tank VCO that provides a fixed, negative conductance. As illustrated in FIG. 3, conventional topology 300 is a balanced LC tank VCO that receives a frequency setting input at terminal node 310 and provides a differential output across terminal nodes 320 and 330. Conventional topology 300 includes a current source 340, an active circuit 350 that provides a negative, active conductance $G_{active}$, a variable capacitor (varactor) 360, a capacitive array 370, and an inductor 380.

Active circuit 350 is formed by a differential pair of transistors M1 and M2 that have been cross coupled in a positive feed back configuration. Specifically, transistors M1 and M2 are p-type metal-oxide semiconductor field effect transistors (MOSFETs), where the gate of each transistor has been connected to the other transistors drain. The source of each transistor is connected to a positive supply voltage Vdd through current source 340. Current source 340 is typically designed to bias transistors M1 and M2, while maintaining a high AC impedance between the sources of transistors M1 and M2 and the positive supply voltage Vdd.

Transistors M1 and M2 essentially form a common-source amplifier with a complex, tuned load that includes varactor 360, capacitive array 370, and inductor 380. The complex, tuned load forms the tank circuit that holds the oscillating energy of the VCO.

Capacitive array 370 includes a plurality of switchable capacitors that are digitally controlled by the frequency setting input received at terminal node 310. In general, the frequency setting input controls the number of switchable capacitors that are coupled to the complex, tuned load. Varying the total capacitance coupled to the complex, tuned load modifies the resonant frequency of the LC tank VCO, thereby changing the frequency of the differential output signal provided across terminal nodes 320 and 330. In an RF front-end, capacitive array 370 can be designed to modify the resonant frequency of the complex, tuned load such that the differential output signal, provided across terminal nodes 320 and 330, has a frequency substantially equal to any one of a plurality of desired frequency bands.

In order for the complex, tuned load of conventional topology 300 to oscillate, losses incurred by the finite, positive resistance (not shown) of the complex, tuned load must be offset. As noted above, the positive resistance of the complex tuned load is typically dominated by the series resistance of inductor 380.

Active circuit 350 is configured to provide negative conductance $G_{active}$ (or negative resistance $R_{active}$) to offset the losses incurred by the positive resistance of the complex, tuned load. The negative conductance $G_{active}$ is substantially equal to $g_m/2$, where $g_m$ represents the transconductance of transistors M1 and M2. In conventional topology 300, the $g_m$ of transistors M1 and M2 is configured such that active circuit 350 provides a negative conductance $G_{active}$ that offsets the losses incurred by the positive resistance of the complex, tuned load at the lowest frequency setting of the LC tank VCO. Providing a negative conductance $G_{active}$ that offsets the losses incurred by the positive resistance of the complex, tuned load at the lowest frequency setting of the LC tank VCO, guarantees that the LC tank VCO will oscillate over all other higher frequency settings. However, simply providing a negative conductance $G_{active}$ that satisfies this worst case operating scenario (i.e., the lowest frequency setting of the LC tank VCO) is not optimal in terms of output phase noise. Rather, as noted above in regard to FIG. 2, it would be beneficial to change the negative conductance $G_{active}$ based on a current frequency setting (e.g., high, medium, or low) of the LC tank VCO in order to provide reduced phase noise, while still offsetting the losses incurred by the positive resistance of the complex, tuned load.

Figure 4:
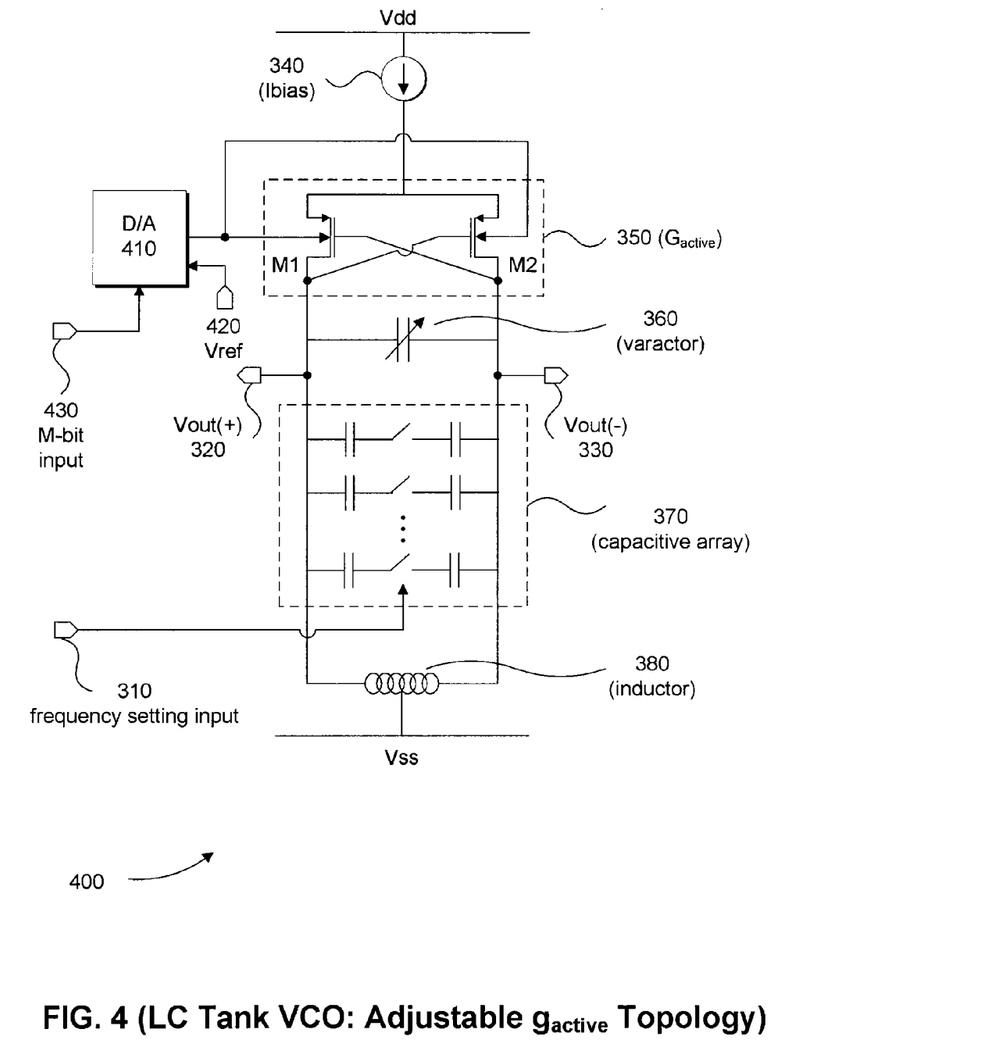
FIG. 4 illustrates a topology for an LC tank VCO that has an adjustable, active conductance, according to embodiments of the present invention.

FIG. 4, described below, illustrates a topology 400 that is configured to vary the negative conductance together with the frequency setting of the LC tank VCO.

4. LC Tank VCO Topology with Adjustable Conductance

FIG. 4 illustrates a topology 400 for an LC tank VCO that provides an adjustable, negative conductance, according to embodiments of the present invention. In general, topology 400 includes substantially the same structure as conventional topology 300, illustrated in FIG. 3. However, topology 400 further includes a digital-to-analog (D/A) converter 410.

D/A converter 410 receives a reference voltage Vref at a terminal node 420 and an M-bit digital input code at terminal node 430. D/A converter 410 is configured to provide an output voltage that is proportional to the M-bit digital input code. In an embodiment, the maximum output voltage of D/A converter 410 is substantially determined by Vref. The output voltage provided by D/A converter 410 is coupled to the body terminals of transistors M1 and M2. As will be described further below, the $g_m$ of transistors M1 and M2 can be adjusted by controlling the voltage applied to their body terminals. In this way, the active conductance $G_{active}$, which is dependent on the $g_m$ of transistors of M1 and M2, can further be adjusted.

The $g_m$ of transistors M1 and M2 is approximately given by:

$$g_m = \frac{2 \times Ibias}{V_{GS} - |V_{thp}|} \quad (6)$$

where Ibias is the current provided by current source 340, $V_{GS}$ is the gate to source voltage of transistors M1 and M2, and $V_{thp}$ is the threshold voltage of transistors M1 and M2. In general, $V_{thp}$ is the value of $V_{GS}$ that turns on transistors M1 and M2 and is directly related to the body voltage of transistors M1 and M2. In other words, if the body voltage of transistors M1 and M2 is increased, the magnitude of $V_{thp}$ is increased and if the body voltage of transistors M1 and M2 is decreased, the magnitude of $V_{thp}$ is decreased. Thus, given the dependency of $g_m$ on $V_{thp}$ from equation (6), the body voltage is directly related to $g_m$; that is, as the body voltage of transistors M1 and M2 is increased, $g_m$ increases and if the body voltage of transistors M1 and M2 decreases, $g_m$ decreases.

D/A converter 410 can be controlled to adjust the $g_m$ of transistors M1 and M2 and, thereby, the negative conductance $G_{active}$, where $G_{active}$ is substantially equal to $g_m/2$. Specifically, as the frequency setting input received at terminal node 310 is varied to change the frequency of the LC tank VCO, the M-bit digital input code received at terminal node 430 can further be varied in relation to the frequency setting input such that $G_{active}$ provides a sufficient negative conductance to overcome the positive resistance of the tank circuit formed by varactor 460, capacitive array 470, and inductor 480. In particular, the M-bit digital input code, received at terminal node 430, can be varied to provide a sufficient negative conductance $G_{active}$ to overcome the positive resistance of the tank circuit, while reducing or minimizing the phase noise associated with the output signal provided across terminal nodes 320 and 330 (e.g., as illustrated in FIG. 2).

In an embodiment, the body voltage of transistors M1 and M2 is increased as the frequency setting input, received at terminal node 310, is varied to increase the capacitance coupled to the complex, tuned load of the LC tank VCO. In another embodiment, the body voltage of transistors M1 and M2 is decreased as the frequency setting input, received at terminal node 310, is varied to reduced the capacitance coupled to the complex, tuned load of the LC tank VCO. In a further embodiment, the M-bit input, received at terminal node 430, is coupled to a subset of the digital bits of the frequency setting input received at terminal node 310. For example, assuming frequency setting input 310 includes N-bits, where N>M, the M-bit input 430 can be coupled to an M-bit subset of the N-bits. In yet another embodiment, the frequency setting input, received at terminal node 310, and the M-bit input, received at 430, are generated by a control module implemented as a processor (e.g., a signal processor or CPU), a state machine implemented in fixed or programmable hardware, combinational logic, or any combination thereof.

Topology 400 advantageously provides for different sets of values for the negative conductance $G_{active}$ provided by cross-coupled transistors M1 and M2, while requiring no additional cross-coupled pairs or switches within the LC tank VCO, which can further degrade the Q of the tank circuit.

As will be appreciated by one of ordinary skill in the art, topology 400 can be readily implemented as an NMOS VCO using n-type MOSFETs in place of p-type MOSFETs M1 and M2. The n-type MOSFETs can be implemented as deep Nwell devices to allow adjustment of their respective body voltages.

Figure 5:
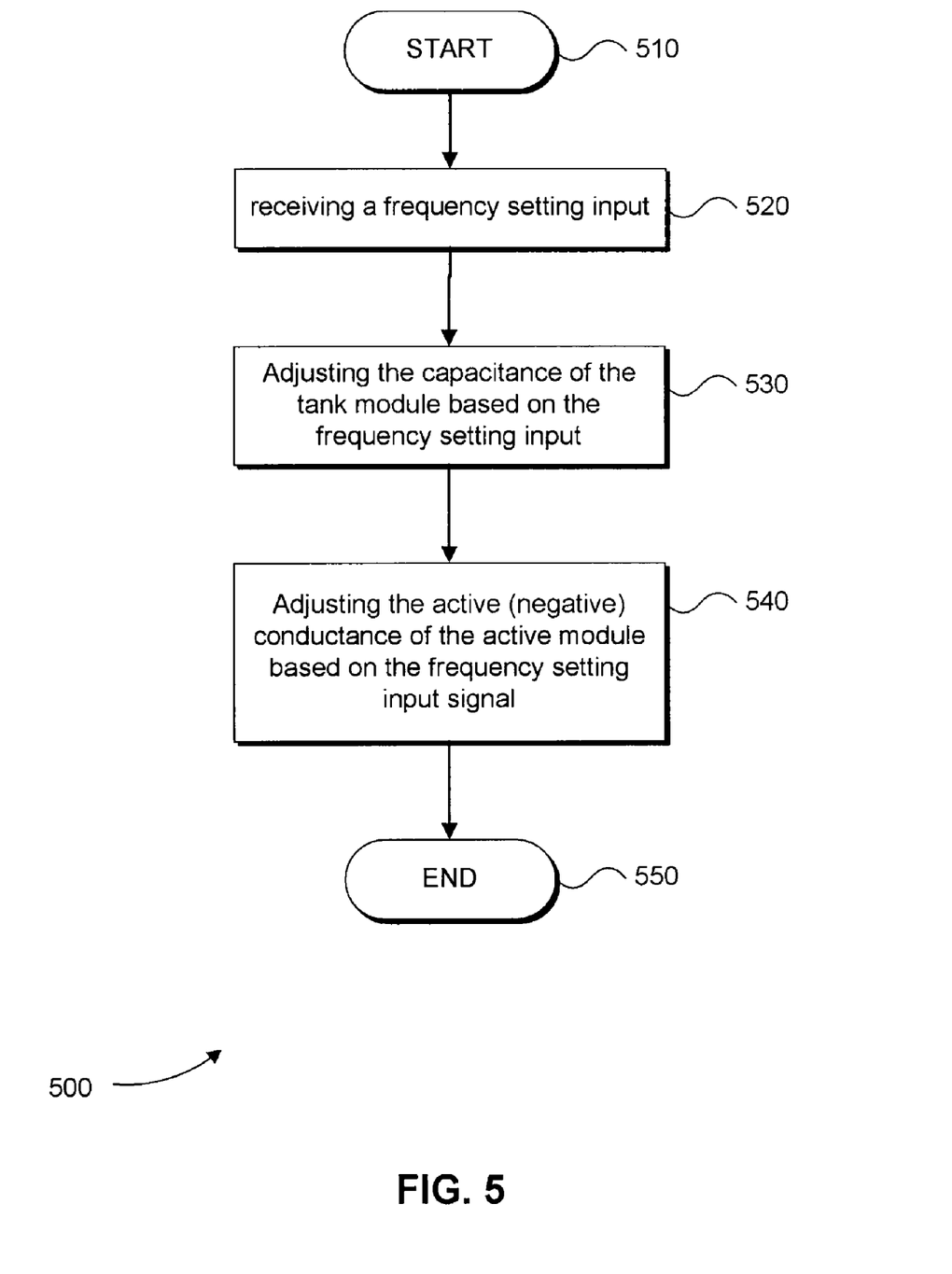
FIG. 5 illustrates an exemplary method for operating the multi-band, LC tank VCO illustrated in FIG. 4, according to embodiments of the present invention.

FIG. 5 illustrates an exemplary method 500 for operating the multi-band, LC tank VCO illustrated in FIG. 4, according to embodiments of the present invention. Method 500 will be described below in reference to FIG. 4.

Method 500 begins at step 510 and proceeds to step 520. At step 520 the LC tank VCO receives a frequency setting input and proceeds to step 530.

At step 530, the LC tank VCO adjusts a capacitance of the tank module, included within the LC tank VCO, based on the frequency setting input. As illustrated in FIG. 4, a capacitive array 370 can provide such flexibility and adjustable capacitance. After adjusting the capacitance of the tank module, method 500 proceeds to step 540.

At step 540, the LC tank VCO adjusts the active (negative) conductance of active module 350, as illustrated in FIG. 4. Specifically a D/A converter 410 can be used to adjust the body voltage of transistor(s) used to implement active module 350. Adjusting the body voltage, in turn, adjusts the active (negative) conductance provided by active module 350. The active negative conductance is used to substantially cancel out a positive conductance associated with the tank module of the LC tank VCO. In an embodiment, the active (negative) conductance of active module 350 is increased if the frequency of the oscillating energy of the tank module is reduced. In another embodiment, the active (negative) conductance of active module 350 is decreased if the frequency of the oscillating energy of the tank module is increased.

5. Conclusion

It is to be appreciated that the Detailed Description section, and not the Abstract section, is intended to be used to interpret the claims. The Summary section may set forth one or more but not all exemplary embodiments of the present invention as contemplated by the inventor(s), and thus, is not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A multi-band voltage controlled oscillator (VCO) for adjusting a frequency of an output signal based on an input signal, the multi-band VCO comprising:
   a tank module comprising a parallel combination of a capacitor and an inductor configured to hold oscillating energy of the output signal, the parallel combination having a positive conductance;
   an active module comprising a pair of cross-coupled transistors configured to provide a negative conductance that cancels out the positive conductance; and
   a control module configured to adjust a body voltage of the cross-coupled transistors based on the frequency of the output signal to improve a phase noise associated with the output signal.

2. The multi-band VCO of claim 1, wherein the output signal is taken across the parallel combination of the tank module.

3. The multi-band VCO of claim 1, wherein the frequency of the output signal is determined based on a resonant frequency of the parallel combination.

4. The multi-band VCO of claim 1, wherein the capacitor is a tunable capacitive array.

5. The multi-band WO of claim 4, wherein the capacitor is configured to be tuned based on the input signal.

6. The multi-band VCO of claim 1, wherein adjusting the body voltage of the cross-coupled transistors changes a magnitude of the negative conductance provided by the active module.

7. The multi-band VCO of claim 1, wherein the control module is a digital-to-analog converter.

8. A multi-band voltage controlled oscillator (VCO) for adjusting a frequency of an output signal based on an input signal, the multi-band VCO comprising:
   a tank module comprising a parallel combination of a capacitor and an inductor configured to hold oscillating energy of the output signal; and
   an active module comprising a pair of cross-coupled transistors configured to provide a negative conductance that cancels out a positive conductance associated with the tank module;
   wherein a body voltage of the cross-coupled transistors is configured to be adjusted based on the frequency of the output signal to improve a phase noise associated with the output signal.

9. The multi-band VCO of claim 8, wherein the output signal is taken across the parallel combination of the tank module.

10. The multi-band VCO of claim 9, wherein the frequency of the output signal is determined based on a resonant frequency of the parallel combination.

11. The multi-band VCO of claim 9, wherein the capacitor is a tunable capacitive array.

12. The multi-band VCO of claim 11, wherein the capacitor is configured to be tuned based on the input signal.

13. The multi-band VCO of claim 9, wherein adjusting the body voltage of the cross-coupled transistors changes a magnitude of the negative conductance provided by the active module.

14. A method for operating a multi-band voltage controlled oscillator (VCO) comprising a tank module configured to hold oscillating energy and an active module configured to provide a negative conductance that cancels out a positive conductance associated with the tank module, the method comprising:

receiving a frequency setting input signal;

adjusting a capacitance of the tank module based on the frequency setting input signal to control a frequency of the oscillating energy; and adjusting the negative conductance of the active module based on the frequency setting input signal to improve a phase noise associated with the oscillating energy.

15. The method of claim 14, wherein the adjusting the negative conductance of the active module comprises adjusting a body voltage of a transistor.

16. The method of claim 14, wherein the adjusting the negative conductance of the active module comprises increasing the negative conductance of the active module if a frequency of the oscillating energy is reduced.

17. The method of claim 14, wherein the adjusting the negative conductance of the active module comprises decreasing the negative conductance of the active module if a frequency of the oscillating energy is increased.

* * * * *

UNITED STATES PATENT AND TRADEMARK OFFICE
CERTIFICATE OF CORRECTION

| | |
|---|---|
| PATENT NO. | : 8,098,111 B2 |
| APPLICATION NO. | : 12/693993 |
| DATED | : January 17, 2012 |
| INVENTOR(S) | : Calvin Shr-Lung Chen |

It is certified that error appears in the above-identified patent and that said Letters Patent is hereby corrected as shown below:

Title Page, Item (54), please replace "Reduced" with --A Reduced--.

Column 8, Line 40, Claim 5, please replace "WO" with --VCO--.

Signed and Sealed this
Twenty-eighth Day of February, 2012

David J. Kappos
*Director of the United States Patent and Trademark Office*

UNITED STATES PATENT AND TRADEMARK OFFICE
CERTIFICATE OF CORRECTION

PATENT NO.         : 8,098,111 B2                         Page 1 of 1
APPLICATION NO.    : 12/693993
DATED              : January 17, 2012
INVENTOR(S)        : Calvin Shr-Lung Chen et al.

It is certified that error appears in the above-identified patent and that said Letters Patent is hereby corrected as shown below:

Title Page,
Item [54], Title, the word "A" (as inserted by Certificate of Correction issued February 2012) should be deleted and title is reinstated to read -- REDUCED PHASE NOISE MULTI-BAND VCO --.

Signed and Sealed this
Twenty-seventh Day of March, 2012

David J. Kappos
*Director of the United States Patent and Trademark Office*